(12) United States Patent
Nishiyama et al.

(10) Patent No.: US 7,944,264 B2
(45) Date of Patent: May 17, 2011

(54) VARIABLE DELAY CIRCUIT, VARIABLE DELAY CIRCUIT CONTROLLING METHOD, AND INPUT/OUTPUT CIRCUIT

(75) Inventors: Ryuichi Nishiyama, Kawasaki (JP); Naoya Shibayama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/656,239

(22) Filed: Jan. 21, 2010

(65) Prior Publication Data

US 2010/0123503 A1 May 20, 2010

Related U.S. Application Data

(63) Continuation of application No. PCT/JP2007/064801, filed on Jul. 27, 2007.

(51) Int. Cl.
*H03H 11/26* (2006.01)
(52) U.S. Cl. .................... 327/276; 327/154; 327/158
(58) Field of Classification Search .......... 327/276–277, 327/284, 154–155, 158, 159, 161, 163
See application file for complete search history.

(56) References Cited

U.S. PATENT DOCUMENTS

| 5,285,122 | A | 2/1994 | Honda et al. | |
| 6,486,716 | B1 * | 11/2002 | Minami et al. | 327/152 |
| 6,525,585 | B1 * | 2/2003 | Iida et al. | 327/279 |

FOREIGN PATENT DOCUMENTS

| JP | 3-238912 | 10/1991 |
| JP | 5-14150 | 1/1993 |
| JP | 2000/201059 | 7/2000 |
| JP | 2000-315941 | 11/2000 |

OTHER PUBLICATIONS

English Translation of the International Preliminary Report on Patentability issued Feb. 9, 2010 in corresponding International Patent Application PCT/JP2007/064801.
International Search Report for PCT/JP2007/064801, mailed Aug. 28, 2007.

* cited by examiner

*Primary Examiner* — An T Luu
(74) *Attorney, Agent, or Firm* — Staas & Halsey LLP

(57) ABSTRACT

A variable delay circuit includes: a first delay section that changes a first drive capability or a first capacity load, receives the reference signals, and generates a first delayed signal by giving a first delay to the reference signal; a second delay section that changes a second drive capability or a second capacity load of the second delay section, receives the reference signal, and generates a second delayed signal by giving a second delay to the reference signal; a first capacity load setting section that sets at least one of the first capacity load and the second capacity load; a first phase comparing section that compares a first phase of the first delayed signal with a second phase of the second delayed signal; and a drive capability setting section that controls the first drive capability and the second drive capability.

20 Claims, 7 Drawing Sheets

UNIT DELAY SETTING BIT

22

US 7,944,264 B2

VARIABLE DELAY CIRCUIT, VARIABLE DELAY CIRCUIT CONTROLLING METHOD, AND INPUT/OUTPUT CIRCUIT

CROSS-REFERENCE TO RELATED APPLICATIONS

This application is a continuation application, filed under 35 U.S.C. §111(a), of PCT Application No. PCT/JP2007/064801, filed on Jul. 27, 2007, the disclosure of which is herein incorporated in its entirety by reference.

FIELD

The embodiment discussed herein is related to a variable delay circuit that adjusts the amount of delay, a variable delay circuit controlling method, and an input/output circuit.

BACKGROUND

A conventional VDL (Variable Delay Line: a variable delay circuit) has a plurality of delay paths that are different in the amount of delay. Since the conventional VDL does not have a mechanism to determine the amount of delay, the appropriate delay path has been selected in accordance with the amount of delay at the time of designing to determine the amount of delay.

Incidentally, a widely known relevant technology is a phase adjustment circuit that can adjust the difference in phase of two pulse signals so that there is substantially a phase difference of 180 degrees between the pulse signals even if there is variation in the amount of delay of the individual inverters that constitute the variable delay circuit. [Patent Document 1] Japanese Laid-Open Patent Publication No. 2000-315941

However, the conventional VDL may not be able to ensure the accuracy and range of adjusting the amount of delay to be suitable for the frequency of external input signals. Moreover, the conventional VDL cannot take into account manufacturing variation, temperatures inside chips and a drop in voltage of a power supply when adjusting the amount of delay.

SUMMARY

According to an aspect of the invention, a variable delay circuit adjusts a delay given to a first input signal which is one of a reference signal and a data signal according to a second input signal which is the other of the reference signal and the data signal, the circuit including: a first delay section that changes a first drive capability of the first delay section or a first capacity load of the first delay section according to a first control signal, receives the reference signals, and generates a first delayed signal by giving a first delay to the reference signal; a second delay section that changes a second drive capability of the second delay section or a second capacity load of the second delay section according to a second control signal, receives the reference signal, and generates a second delayed signal by giving a second delay to the reference signal; a first capacity load setting section that sets at least one of the first capacity load and the second capacity load by providing the first control signal and the second control signal, in order that the first capacity load differs from the second capacity load; a first phase comparing section that compares a first phase of the first delayed signal with a second phase of the second delayed signal; and a drive capability setting section that controls the first drive capability and the second drive capability by providing the first control signal and the second control signal, according to a result of the comparing of the first phase and the second phase, in order that a difference between the first delay and the second delay is equal to a predetermined value and the first drive capability is equal to the second drive capability.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT(S)

Hereinafter, an example of an embodiment of the present invention will be described with reference to the accompanying diagrams.

According to the present embodiment, VDL (Variable Delay Circuit) has a phase determination function and can adjust the delay adjustment range so that the delay adjustment range is one cycle (or two cycles) of a periodic signal that is an external input signal. Moreover, the VDL can adjust the delay adjustment accuracy (resolution) as well as the delay adjustment range.

According to the present embodiment, the VDL performs an accuracy adjustment process before system operation to determine the delay adjustment accuracy and the delay adjustment range, and performs a delay adjustment process at the time of system operation.

First, the configuration of the VDL of the present embodiment will be described.

Figure 1:
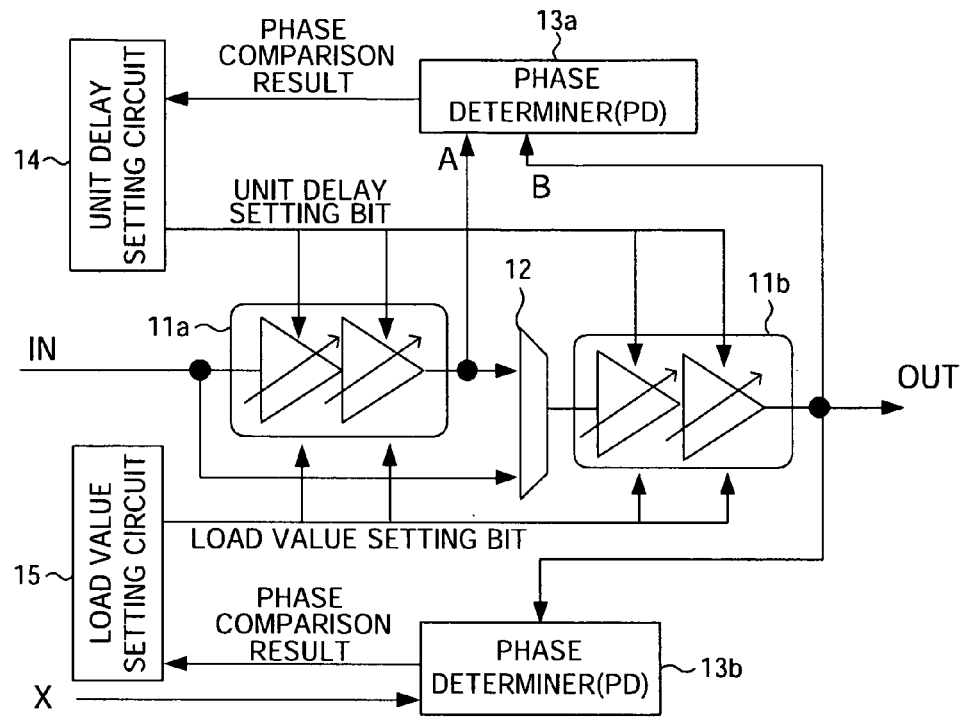
FIG. 1 is a circuit diagram illustrating an example of the configuration of VDL according to an embodiment of the present invention.

FIG. 1 is a circuit diagram illustrating an example of the configuration of the VDL according to the present embodiment. The VDL is equipped with VDL macros 11a (a first delay section) and 11b (a second delay section), a selector 12, phase determiners (PD: Phase Detector) 13a (a first phase comparing section) and 13b (a second phase comparing section), a unit delay setting circuit 14 (a drive capability setting section), and a load value setting circuit 15. During the accuracy adjustment process, the VDL macros 11a and 11b, the selector 12, the phase determiner 13a, and the unit delay setting circuit 14 are used; during the delay adjustment process, the VDL macros 11a and 11b, the selector 12, the phase determiner 13b, and the load value setting circuit 15 are used.

The VDL macros 11a and 11b are connected in series through the selector 12. The VDL macro 11a is a front stage, and the VDL macro 11b is a rear stage. An input signal that is input into an input terminal IN of the VDL is output to the VDL macro 11a and the selector 12. The selector 12 selects the output A of the VDL macro 11a or IN and outputs the selected one to the VDL macro 11b. The VDL macro 11b outputs the output B to the output terminal OUT of the VDL and the phase determiners 13a and 13b.

The phase determiner 13a compares A (a first delayed signal) and B (a second delayed signal) in phase, and outputs the phase comparison result to the unit delay setting circuit 14. The unit delay setting circuit 14 sets, based on the phase comparison result by the phase determiner 13a, a unit delay in the VDL macros 11a and 11b. A data signal that is input into an input terminal X is output to the phase determiner 13b. The phase determiner 13b compares X (a third delayed signal) and B (a fourth delayed signal) in phase, and outputs the phase comparison result to the load value setting circuit 15. The load value setting circuit 15 sets, based on the phase comparison result by the phase determiner 13b, a load value in the VDL macros 11a and 11b.

The following describes the configuration of the VDL macros 11a and 11b.

Figure 2:
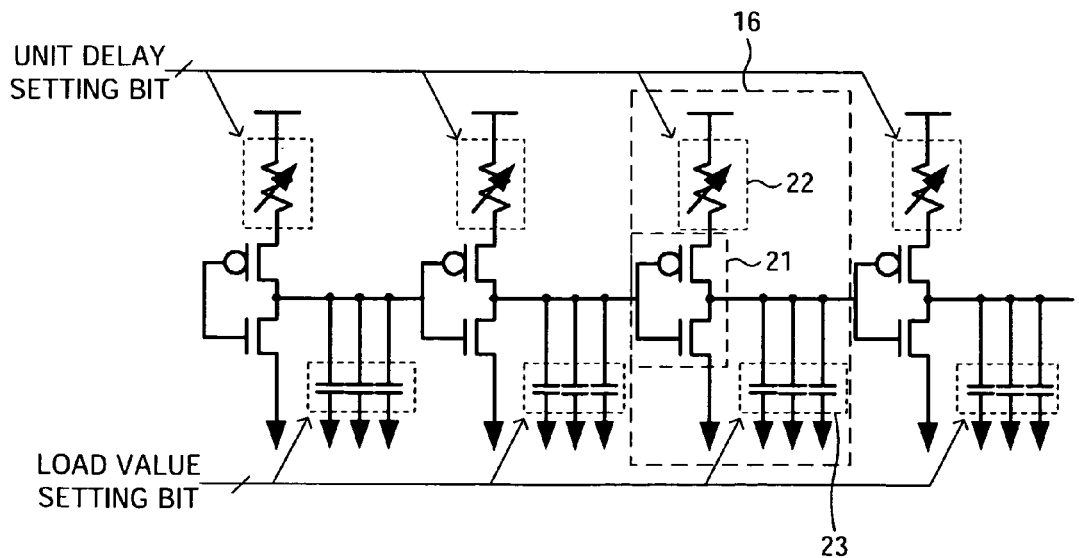
FIG. 2 is a circuit diagram illustrating an example of the configuration of a VDL macro according to an embodiment of the present invention.

The VDL macros 11a and 11b include the same number of VDL cells 16 that have the same configuration. FIG. 2 is a circuit diagram illustrating an example of the configuration of the VDL macro according to the present embodiment. In the example, the VDL macro 11a includes four VDL cells; the four VDL cells 16 are connected in series. The VDL macro 11b has the same configuration as the VDL macro 11a. The VDL cell 16 includes an inverter 21, a variable resistance 22, and a variable capacitance 23.

Figure 3:
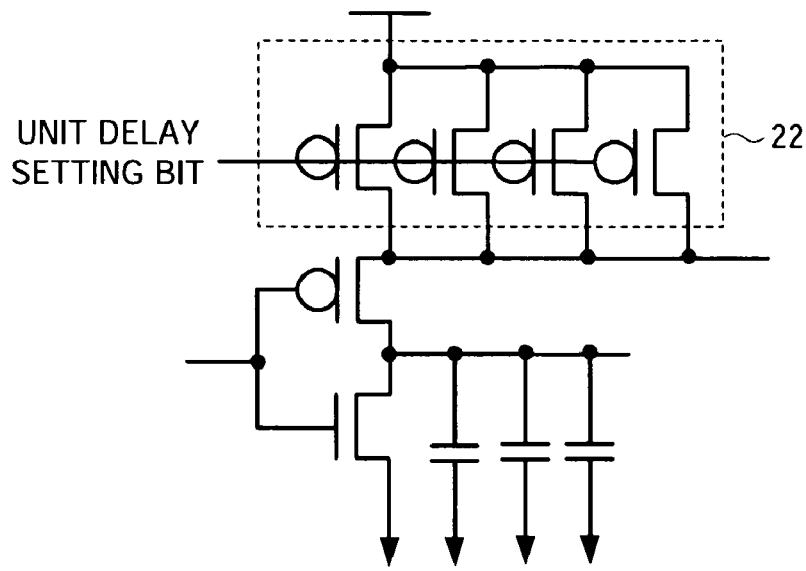
FIG. 3 is a circuit diagram illustrating an example of the configuration of a variable resistance according to an embodiment of the present invention.

The resistance value of the variable resistance 22 is determined in accordance with a unit delay setting bit output from the unit delay setting circuit 14. FIG. 3 is a circuit diagram illustrating an example of the configuration of the variable resistance according to the present embodiment. The variable resistance 22 includes a plurality of PMOSs (P-channel Metal Oxide Semiconductor). The number of PMOSs to be turned on is set in accordance with the unit delay setting bit. The resistance of the variable resistance 22 determines the drive capability of the VDL cell 16. The smaller the resistance value is, the larger the drive capability is.

The capacitance value of the variable capacitance 23 is determined in accordance with a load value setting bit output from the load value setting circuit 15. The variable capacitance 23 includes capacitors the number of which is N. The number of capacitors to be connected (capacity load value) is set in accordance with the load value setting bit. Accordingly, the capacity load value is set in the range of zero to N.

Figure 4:
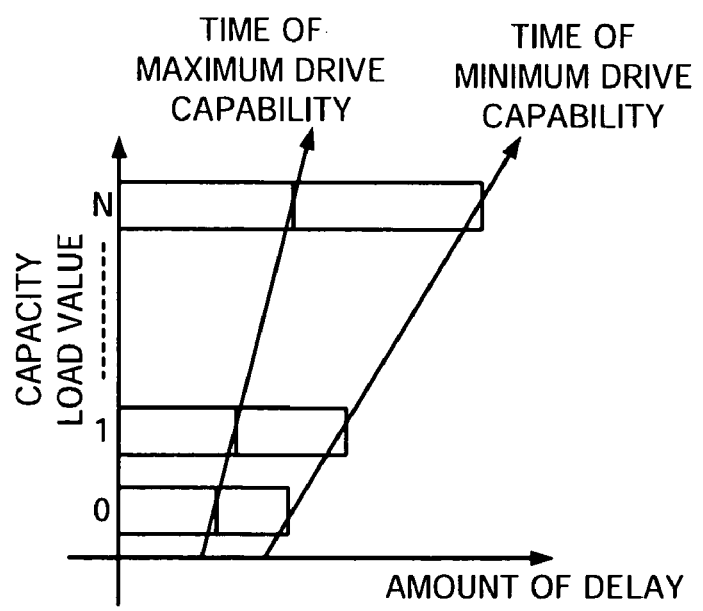
FIG. 4 is a diagram illustrating an example of determining the amount of delay of a unit cell according to an embodiment of the present invention.

Moreover, the amount of delay of the VDL cell 16 is determined in accordance with the drive capability and the capacity load value. FIG. 4 is a diagram illustrating an example of determining the amount of delay of a unit cell according to the present embodiment. In the diagram, the vertical axis represents the capacity load value, and the horizontal axis represents the amount of delay of the VDL cell 16 (delay time). The larger the capacity load value of the VDL cell 16 is, the larger the amount of delay of the VDL cell 16 is.

Moreover, the maximum drive capability is a drive capacity when the resistance of the variable resistance 22 is set at a minimum level. The minimum drive capability is a drive capacity when the resistance of the variable resistance 22 is set at a maximum level. A line indicated by At Time of Maximum Drive Capability represents the correlation between capacity load values and the amount of delay when the drive capability is kept at a maximum level. Similarly, a line indicated by At Time of Minimum Drive Capability represents the correlation between capacity load values and the amount of delay when the drive capability is kept at a minimum level. The smaller the drive capability of the VDL cell 16 is, the larger the amount of delay of the VDL cell 16 is.

During the delay adjustment process, when the amount of delay is controlled only by the capacity load value with the fixed drive capability, the delay adjustment range is the difference between the amount of delay obtained when the capacity load value is N and the amount of delay obtained when the capacity load value is zero. Accordingly, the smaller the drive capability is, the broader the delay adjustment range is, and the rougher the adjustment accuracy (resolution) is.

The following describes the accuracy adjustment process before system operation.

Hereinafter, the VDL macro 11a is referred to as a front stage; the VDL macro 11b is referred to as a rear stage.

Figure 5:
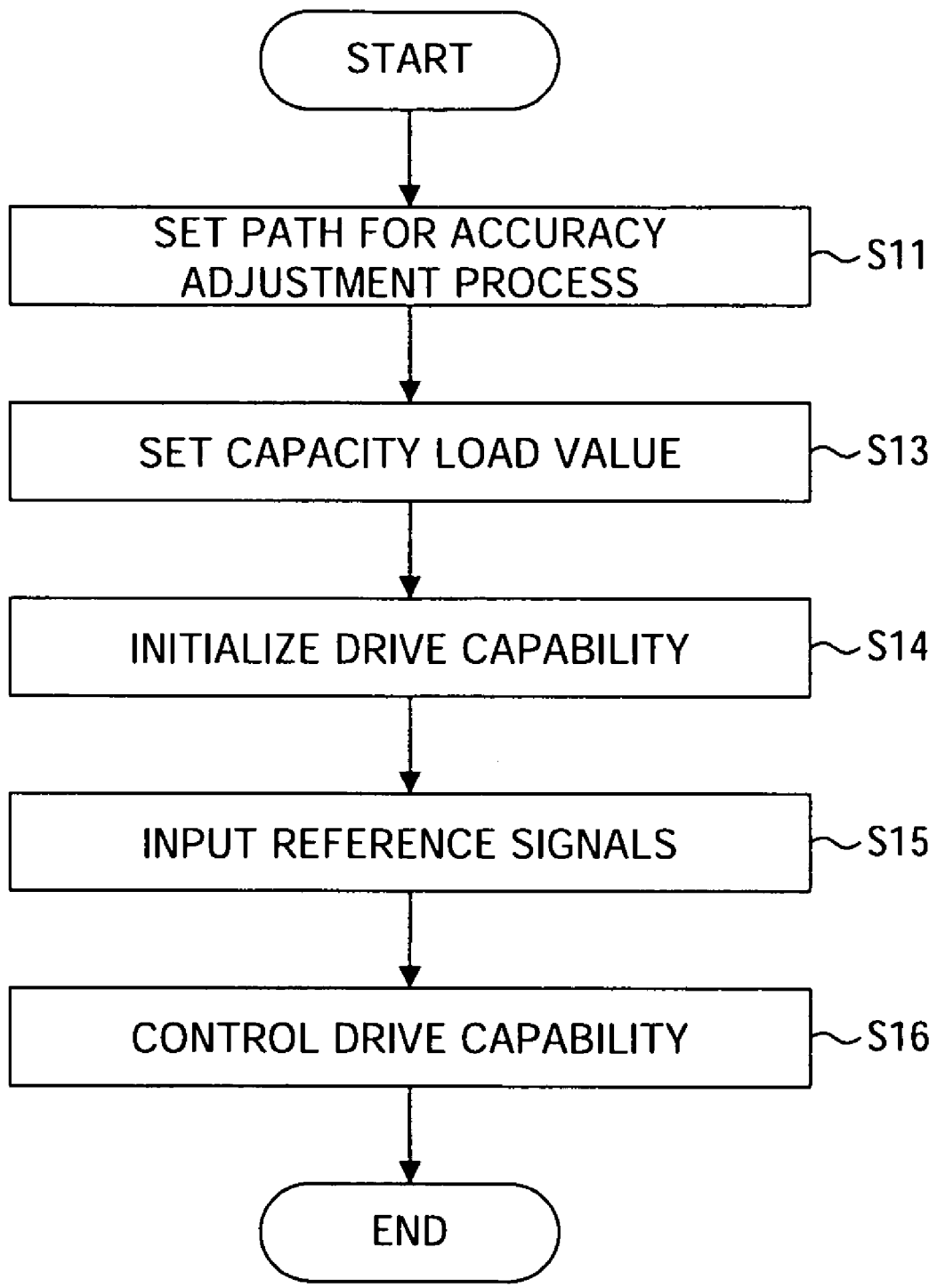
FIG. 5 is a flowchart illustrating an example of an accuracy adjustment process according to an embodiment of the present invention.

FIG. 5 is a flowchart illustrating an example of the accuracy adjustment process according to the present embodiment. The selector 12 is switched to a path for the accuracy adjustment process (IN is selected as an input) to input IN into both the front and rear stages (S11). Here, the front-stage output A and the rear-stage output B that has bypassed the front stage are input into the phase determiner 13a. The load value setting circuit 15 sets the capacity load value of the front stage at the minimum value (zero) and the capacity load value of the rear stage at the maximum value (N), and the capacity load values are fixed in the subsequent processes (S13).

The unit delay setting circuit 14 sets the resistance value (unit delay) of the variable resistances 22 of the front and rear stages at the minimum value (maximum drive capability) to minimize the amount of delay (S14). System reference signals (reference signals) having a target frequency are input into IN (S15). The unit delay setting circuit 14 increases, based on the phase comparison result by the phase determiner 13a, the resistance value of the front and rear stages (S16).

Figure 6:
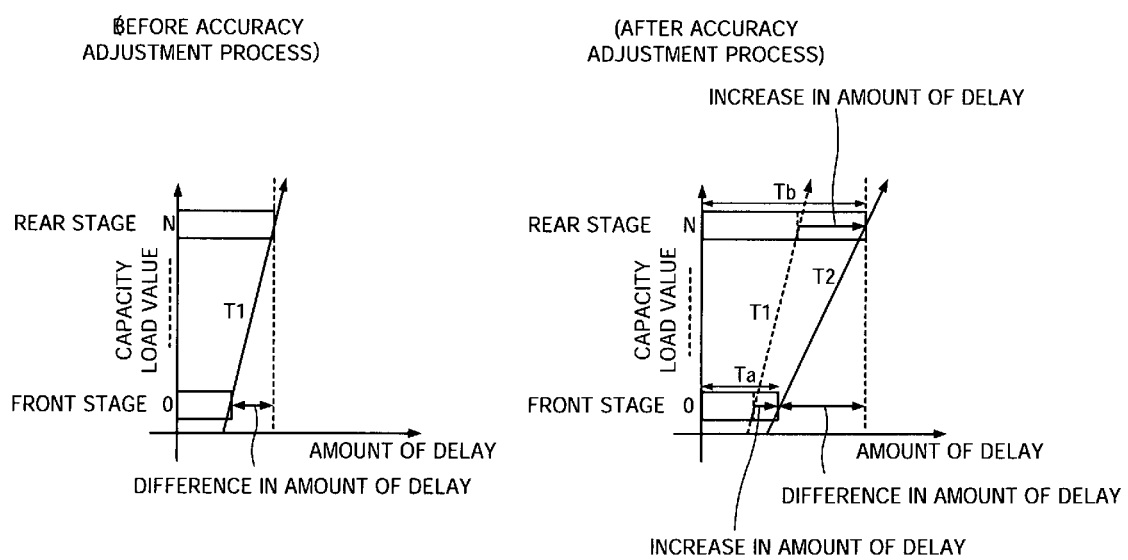
FIG. 6 is a diagram illustrating an example of a delay adjustment range according to an embodiment of the present invention.

FIG. 6 is a diagram illustrating an example of the delay adjustment range according to the present embodiment. In the diagram, the vertical axis represents the capacity load value, and the horizontal axis represents the amount of delay of the front or rear stage (delay time). Moreover, in the diagram, the graph on the left side represents the amount of delay of the front and rear stages before the accuracy adjustment process (at the time of maximum drive capability); the graph on the right side represents the amount of delay of the front and rear stages after the accuracy adjustment process.

In the process S16, the change in resistance value of the front and rear stages comes to an end when the difference in the amount of delay between the front and rear stages becomes equal to half a cycle of the target frequency. That is, if the amount of delay of the front stage, the amount of delay of the rear stage, and the cycle of the target frequency are assumed to be Ta, Tb, and Cycle, respectively, the difference in the amount of delay between the front and rear stages is (Tb−Ta)=Cycle/2. Here, the initial value of the difference in the amount of delay is assumed to be less than or equal to Cycle/2. The difference in the amount of delay is the delay adjustment range of only the front or rear stage.

Moreover, in FIG. 6, a line T1 connects the amount of delay of the front stage to the amount of delay of the rear stage before the accuracy adjustment process (the drive capability of the front and rear stages is at an initial value (maximum value)) and represents a change in the amount of delay when the capacity load value is controlled under the condition. Similarly, a line T2 connects the amount of delay of the front stage to the amount of delay of the rear stage after the accuracy adjustment process and represents a change in the amount of delay when the capacity load value is controlled under the condition.

Before the accuracy adjustment process (S14), the amount of delay takes the minimum value with the smallest delay adjustment range of the front stage. Moreover, the drive capability decreases (the unit delay increases) after the accuracy adjustment process. As a result, the delay adjustment range of the front stage becomes equal to half a cycle of the target frequency, i.e. Cycle/2.

The following describes the operation of the phase determiner 13a.

Figure 7:
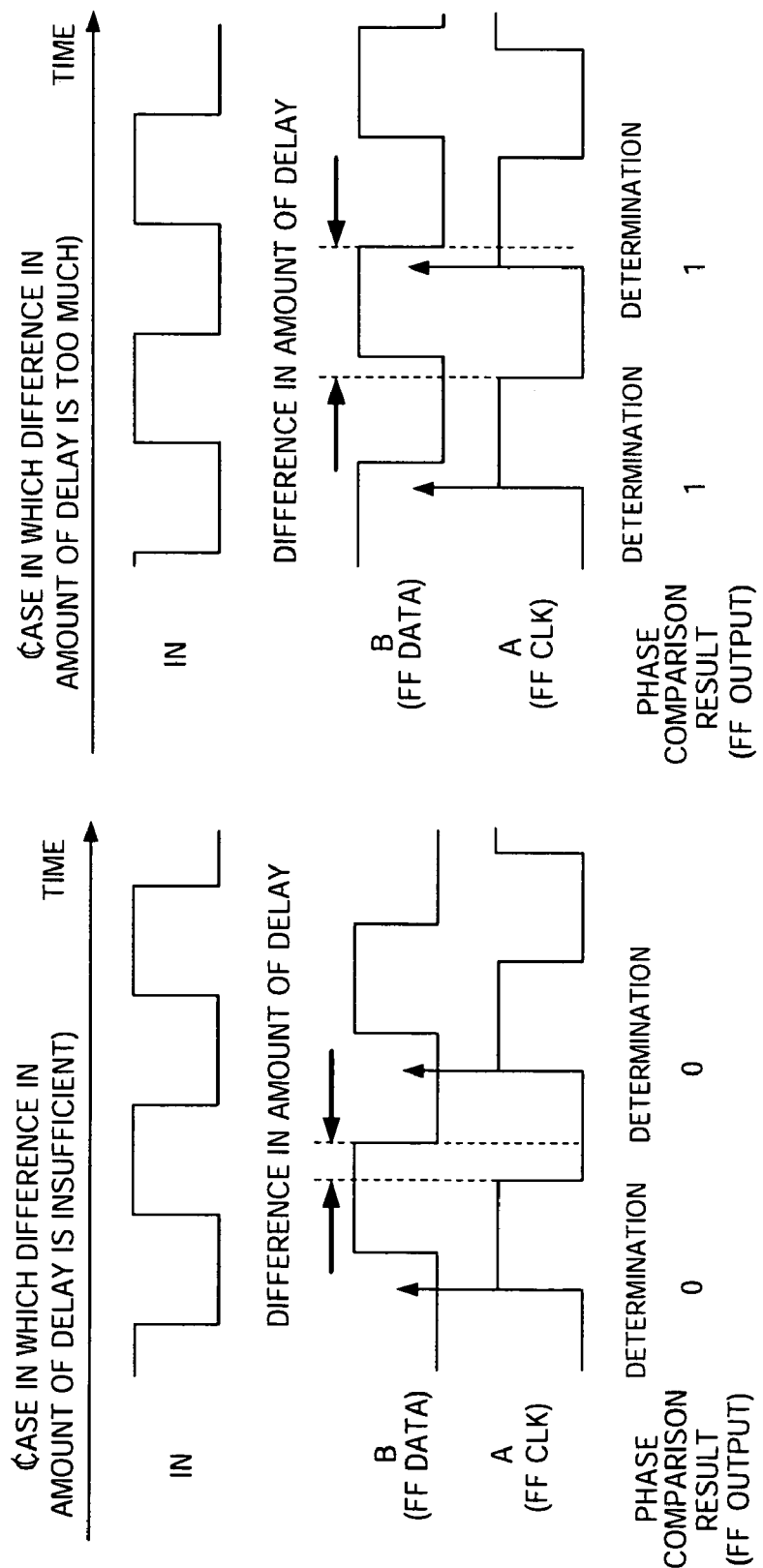
FIG. 7 is a diagram illustrating an example of the operation of a phase determiner according to an embodiment of the present invention.

The phase determiners 13a and 13b are realized by FF (Flip-Flop). The front-stage output A is input into the FF clock input. The rear-stage output B is input into the FF data input. FIG. 7 is a diagram illustrating an example of the operation of the phase determiner according to the present embodiment. The timing chart on the left side illustrates a case in which the difference in the amount of delay (Tb−Ta) is insufficient (less than Cycle/2). The timing chart on the right side illustrates a case in which the difference in the amount of delay is too much (more than Cycle/2). In each of the cases, the diagram depicts, from top to bottom, the waveform of IN, the waveform of B, the waveform of A, and the phase comparison result (FF output). The FF of the phase determiner 13a outputs the value of the data input when the wave of the clock input rises as phase comparison result.

In the case that the difference in the amount of delay is insufficient, the phase determiner 13a outputs "0" as phase comparison result. After receiving the value, the unit delay setting circuit 14 raises the resistance value of the front and rear stages (raises the amount of delay). On the other hand, in the case that the difference in the amount of delay is too much, the phase determiner 13a outputs "1" as phase comparison result. After receiving the value, the unit delay setting circuit 14 decreases the resistance value of the front and rear stages (decreases the amount of delay). Thanks to the operation, the difference in the amount of delay becomes equal to Cycle/2.

The following describes the delay adjustment process at the time of system operation.

Figure 8:
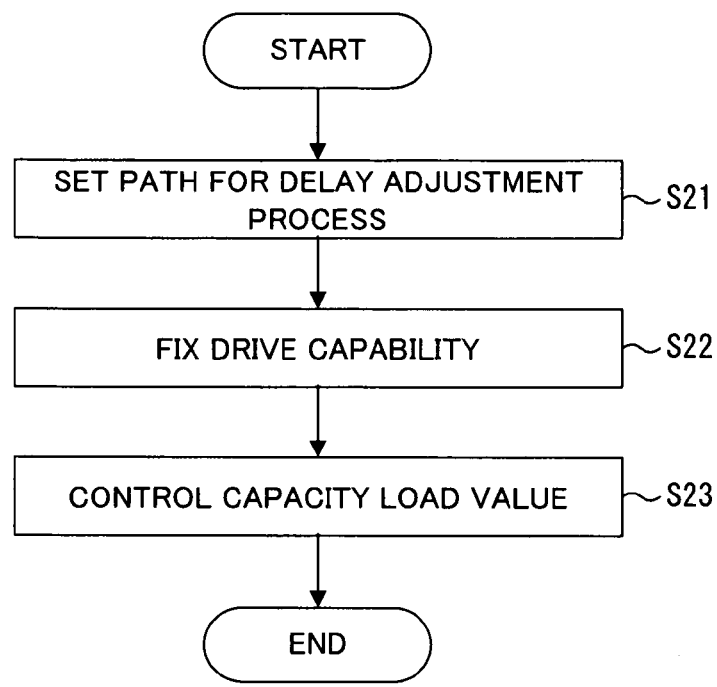
FIG. 8 is a flowchart illustrating an example of a delay adjustment process according to an embodiment of the present invention.

FIG. 8 is a flowchart illustrating an example of the delay adjustment process according to the present embodiment. First, the selector 12 is switched to a path for the delay adjustment process (A is selected as the input), and the front-stage output A is therefore input into the rear stage (S21). Here, either data or the system reference signals are input into IN (a first input signal), and the other of the two is input into X (a second input signal). The unit delay setting circuit 14 stops control based on the phase comparison result, and keeps the unit delay setting bit (resistance value) at the value determined by the accuracy adjustment process (S22). The load value setting circuit 15 controls, based on the phase comparison result by the phase determiner 13b, the capacity load value (S23).

Figure 9:
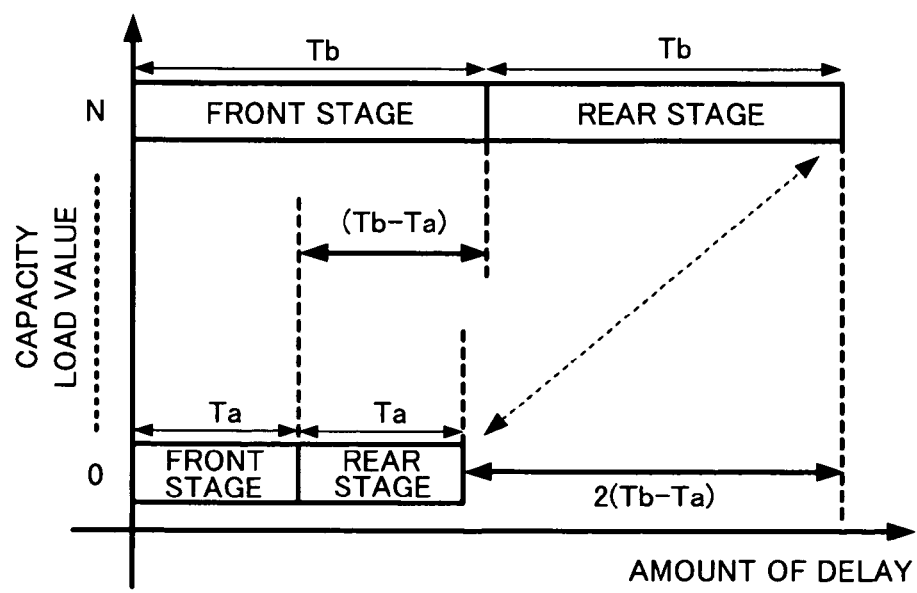
FIG. 9 is a diagram illustrating an example of the delay adjustment process according to an embodiment of the present invention.

FIG. 9 is a diagram illustrating an example of the delay adjustment process according to the present embodiment. In the diagram, the vertical axis represents the capacity load value; the horizontal axis represents the amount of delay of the VDL (delay time). When the capacity load value is set at zero by the delay adjustment process, the VDL has the smallest amount of delay, which is twice as much as the amount of delay Ta of the front stage after the accuracy adjustment process. Moreover, when the capacity load value is set at V by the delay adjustment process, the VDL has the largest amount of delay, which is twice as much as the amount of delay Tb of the rear stage after the accuracy adjustment process. Accordingly, while the difference in the amount of delay between the front and rear stages is set at Cycle/2 by the accuracy adjustment process, the front and rear stages are connected in series. Therefore, the delay adjustment range of the VDL becomes equal to 2(Tb−Ta)=Cycle (one cycle of the external input signal).

Moreover, the delay adjustment accuracy (delay adjustment unit) is represented as follows:

Delay Adjustment Accuracy=Cycle/N

During the delay adjustment process, B is a signal that gives the delay of the front and rear stages to IN. Moreover, in the phase determiner 13b, B is input into the FF clock input, and X is input into the FF data input. Like the phase determiner 13a, the phase determiner 13b outputs the phase comparison result. After receiving the phase comparison result, the load value setting circuit 15 decreases the load value when the phase comparison result is "1." When the phase comparison result is "0," the load value setting circuit 15 increases the load value. Thanks to the operation, B rises at the timing when X rises.

Incidentally, the phase determiners 13a and 13b may be designed to share one phase determiner: the phase determiner serves as the phase determiner 13a during the accuracy adjustment process and as phase determiner 13b during the delay adjustment process.

As described above, the VDL of the present embodiment causes the delay adjustment range to become equal to one cycle of the system reference signals. The VDL also causes the delay adjustment accuracy (resolution) to become equal to 1/N of one cycle of the system reference signals. Therefore, the delay adjustment range and the delay adjustment accuracy are automatically obtained that are suitable for the frequency of the system reference signals.

Incidentally, if the difference in the amount of delay is set at one cycle during the accuracy adjustment process, the delay adjustment range may be two cycles during the delay adjustment process.

The following describes a phase adjustment circuit to which the VDL of the present embodiment is applied.

Before system operation, the system reference signals (clock) are connected to the VDL's IN, and the VDL performs the accuracy adjustment process. In the accuracy adjustment process, the VDL determines the correlation in phase between the front-stage output of the system reference signals and the rear-stage output of the system reference signals to adjust the delay adjustment range and the delay adjustment accuracy. Here, at the time of system operation, data are connected to the VDL's IN, the system reference signals are connected to the VDL's X, and the VDL performs the delay adjustment process. In the delay adjustment process, the VDL determines the correlation in phase between the system reference signals and the rear-stage output of the data to adjust the amount of delay so that the phase of the data output corresponds to that of the system reference signals.

The following describes an I/O circuit (input/output circuit) equipped with the phase adjustment circuit to which the VDL of the present embodiment is applied.

Figure 10:
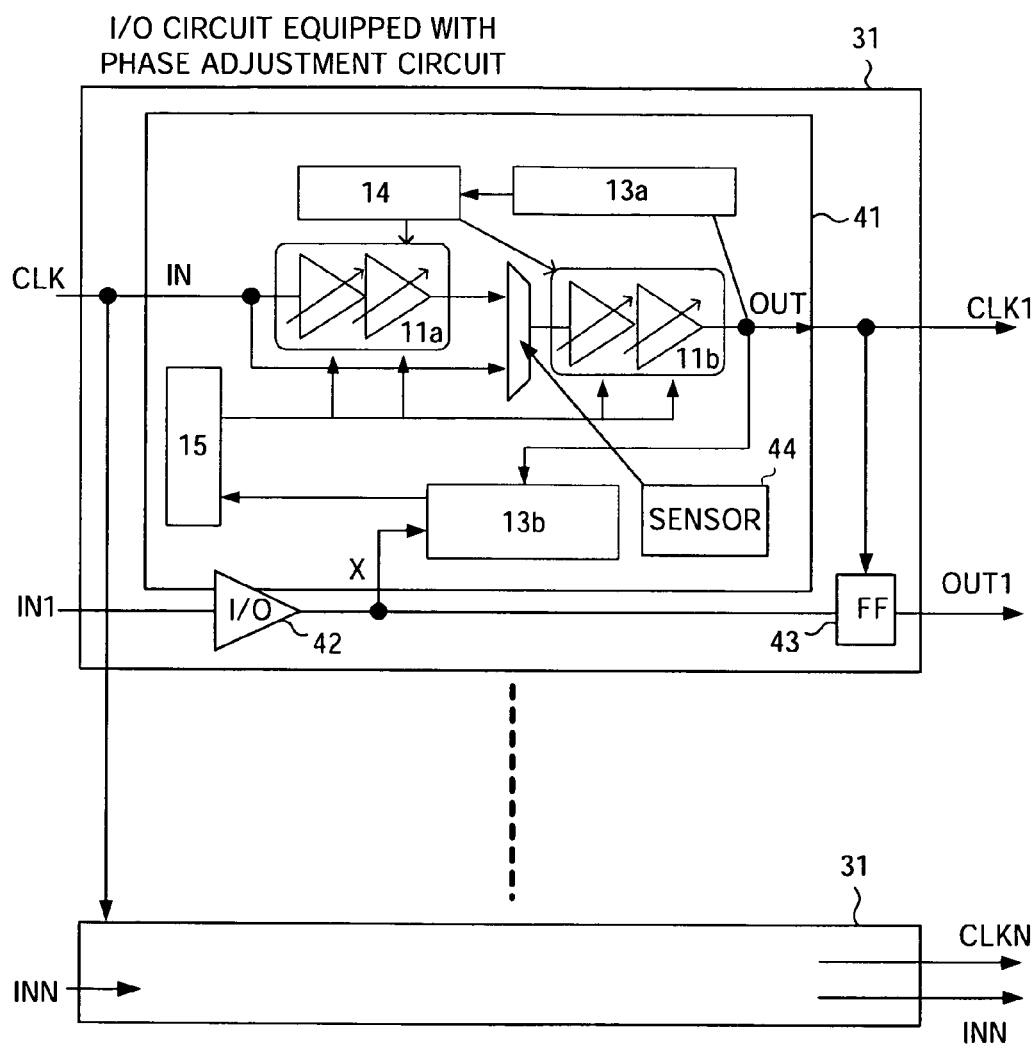
FIG. 10 is a circuit diagram illustrating an example of the configuration of an I/O circuit equipped with a phase adjustment circuit according to an embodiment of the present invention.

The above-described phase adjustment circuit is applied to the I/O circuit. Therefore, the I/O circuit (I/O macro) can be realized that can carry out transmission regardless of skew between data bits. FIG. 10 is a circuit diagram illustrating an example of the configuration of the I/O circuit equipped with the phase adjustment circuit according to the present embodiment. In the diagram, the same reference symbols as those of FIG. 1 represent the same objects as those illustrated in FIG. 1 or equivalents of those illustrated in FIG. 1, which are not described here. In the case of the diagram here, compared with FIG. 1, new I/O circuits 31 the number of which is N are provided. The I/O circuits 31 each include VDL 41, I/O 42 (buffer amplifier), and FF 43 (holding section). Compared with FIG. 1, the VDL 41 includes a new sensor 44. In the example here, the clock input and data input of the FF of the phase determiner 13b are opposite to the above-described connection.

The ith (i=1, 2, ... N) I/O circuit 31 includes CLK and INi as input terminals and CLKi and OUTi as output terminals. CLK is in common among the N I/O circuits 31. The system reference signals are input into the CLK, and data are input into INi.

The following describes the first I/O circuit 31. The CLK is input into IN of the VDL 41. IN1 is amplified by the I/O 42. The output of the I/O 42 is input into X of the VDL 41 and into the data input of the FF 43. The OUT of the VDL 41 is input into the clock input of the FF 43. The output of the FF43 is output to OUT1.

The sensor 44 is a temperature sensor. When the temperature reaches a predetermined value, the sensor 44 switches the selector 12 to a path for the accuracy adjustment process to perform the accuracy adjustment process. Therefore, the delay adjustment accuracy follows the change in temperature. Incidentally, with the help of a timer, the sensor 44 may perform the accuracy adjustment process at regular intervals. Therefore, the delay adjustment accuracy follows the change in environmental conditions like temperatures.

Since the accuracy adjustment process is performed before system operation, the delay adjustment range is adjusted to one cycle of the system reference signals. Moreover, since the delay adjustment process is performed at the time of system operation, the timing of data input follows the timing of clock input in the FF43. Accordingly, the delay adjustment accuracy and delay adjustment range are appropriately set. Therefore, bit skew control is possible without being affected by changes in temperature and power supply voltage. Incidentally, when the CLK and the IN1 are inversely connected, the clock input and data input of the FF of the phase determiner 13b are inversely connected, and the clock input and data input of the FF43 are inversely connected. Alternatively, the VDL 41 is connected to the IN1.

Incidentally, a first capacity load setting section corresponds to the load value setting section of the present embodiment at the time of the accuracy adjustment process. Moreover, a second capacity load setting section corresponds to the load value setting section of the present embodiment at the time of the delay adjustment process.

Moreover, the outputting of a first delayed signal and the outputting of a second delayed signal correspond to the process S11 of the present embodiment. Moreover, the setting of a first capacity load corresponds to the process S13. Moreover, the setting of drive capability corresponds to the processes S14 to S16 of the present embodiment. Moreover, the outputting of a third delayed signal and the outputting of a fourth delayed signal correspond to the process 21 of the present embodiment. Moreover, the setting of a second capacity load corresponds to the process S23 of the present embodiment.

The above variable delay circuit, setting control of the variable delay circuit, and input/output circuit can set, based on reference signals, the accuracy and range of delay adjustment.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a depicting of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A variable delay circuit that adjusts a delay given to a first input signal which is one of a reference signal and a data signal according to a second input signal which is the other of the reference signal and the data signal, the circuit comprising:
   a first delay section that changes a first drive capability of the first delay section or a first capacity load of the first delay section according to a first control signal, receives the reference signals, and generates a first delayed signal by giving a first delay to the reference signal;
   a second delay section that changes a second drive capability of the second delay section or a second capacity load of the second delay section according to a second control signal, receives the reference signal, and generates a second delayed signal by giving a second delay to the reference signal;
   a first capacity load setting section that sets at least one of the first capacity load and the second capacity load by providing the first control signal and the second control signal, in order that the first capacity load differs from the second capacity load;
   a first phase comparing section that compares a first phase of the first delayed signal with a second phase of the second delayed signal; and
   a drive capability setting section that controls the first drive capability and the second drive capability by providing the first control signal and the second control signal, according to a result of the comparing of the first phase and the second phase, in order that a difference between the first delay and the second delay is equal to a predetermined value and the first drive capability is equal to the second drive capability.

2. The variable delay circuit according to claim 1, wherein:
   the first delay section receives the first input signal and generates a third delayed signal by giving a third delay to the first input signal;
   the second delay section receives the third delayed signal and generates a fourth delayed signal by giving a fourth delay to the third delayed signal; and the variable delay circuit further comprises:
a second phase comparing section that compares a third phase of the second input signal with a fourth phase of the fourth delayed signal; and
a second capacity load setting section that controls the first capacity load and the second capacity load by providing the first control signal and the second control signal, according to a result of the comparing of the third phase and the fourth phase, in order that the third phase is equal to the fourth phase and the first capacity load is equal to the second capacity load.

3. The variable delay circuit according to claim 1, wherein the first capacity load setting section sets one of the first capacity load and the second capacity load to a minimum capacity load and sets the other of the first capacity load or the second capacity load to a maximum capacity load.

4. The variable delay circuit according to claim 1, wherein the predetermined value is one or a half cycle of the reference signal.

5. The variable delay circuit according to claim 1, wherein the first delay section includes at least one delay circuit including an inverter, a variable resistance, and a variable capacitance, and
the second delay section includes at least one delay circuit including an inverter, a variable resistance, and a variable capacitance.

6. The variable delay circuit according to claim 5, wherein:
the drive capability setting section sets a resistance value of the variable resistance in the first delay section in order to set the first drive capability and sets a resistance value of the variable resistance in the second delay section in order to set the second drive capability; and
the second capacity load setting section sets a capacitance of the variable capacitance in the first delay section in order to set the first capacity load and sets a capacitance of the variable capacitance in the second delay section in order to set the second capacity load.

7. The variable delay circuit according to claim 1, wherein when the difference is less than the predetermined value, the drive capability setting section decreases the first drive capability and the second drive capability, and when the difference is greater than the predetermined value, the drive capability setting section increases the first drive capability and the second drive capability.

8. The variable delay circuit according to claim 2, wherein when the fourth phase lags behind the third phase, the second capacity load setting section decreases the first capacity load and the second capacity load, and when the fourth phase is ahead of the third phase, the second capacity load setting section increases the first capacity load and the second capacity load.

9. The variable delay circuit according to claim 2, wherein the first capacity load setting section and the second capacity load setting section are the same circuits.

10. The variable delay circuit according to claim 2, wherein the first phase comparing section and the second phase comparing section are the same circuits.

11. A variable delay circuit controlling method for controlling a variable delay circuit that adjusts a delay given to a first input signal which is one of a reference signal and a data signal according to a second input signal which is the other of the reference signal and the data signal, the method comprising:
causing a first delay section, that changes a first drive capability of the first delay section or a first capacity load of the first delay section according to a first control signal, to receive the reference signals and generate a first delayed signal by giving a first delay to the reference signal;
causing a second delay section, that changes a second drive capability of the second delay section or a second capacity load of the second delay section according to a second control signal, to receive the reference signal and generate a second delayed signal by giving a second delay to the reference signal;
setting at least one of the first capacity load and the second capacity load by providing the first control signal and the second control signal, in order that the first capacity load differs from the second capacity load;
comparing a first phase of the first delayed signal with a second phase of the second delayed signal; and
controlling the first drive capability and the second drive capability by providing the first control signal and the second control signal, according to a result of the comparing of the first phase and the second phase, in order that a difference between the first delay and the second delay is equal to a predetermined value and the first drive capability is equal to the second drive capability.

12. The variable delay circuit controlling method according to claim 11, further comprising:
causing the first delay section to receive the first input signal and generate a third delayed signal by giving a third delay to the first input signal;
causing the second delay section to receive the third delayed signal and generate a fourth delayed signal by giving a fourth delay to the third delayed signal;
comparing a third phase of the second input signal with a fourth phase of the fourth delayed signal; and
controlling the first capacity load and the second capacity load by providing the first control signal and the second control signal, according to a result of the comparing of the third phase and the fourth phase, in order that the third phase is equal to the fourth phase and the first capacity load is equal to the second capacity load.

13. The variable delay circuit controlling method according to claim 11, wherein
the setting sets one of the first capacity load and the second capacity load to a minimum capacity load and sets the other of the first capacity load or the second capacity load to a maximum capacity load.

14. The variable delay circuit controlling method according to claim 11, wherein
the predetermined value is one or a half cycle of the reference signal.

15. The variable delay circuit controlling method according to claim 11, wherein
the first delay section includes at least one delay circuit including an inverter, a variable resistance, and a variable capacitance, and
the second delay section includes at least one delay circuit including an inverter, a variable resistance, and a variable capacitance.

16. The variable delay circuit controlling method according to claim 15, wherein
the controlling of the first drive capability and the second drive capability sets a resistance value of the variable resistance in the first delay section in order to set the first drive capability and sets a resistance value of the variable resistance in the second delay section in order to set the second drive capability; and
the controlling of the first capacity load and the second capacity load set a capacitance of the variable capacitance in the first delay section in order to set the first capacity load and sets a capacitance of the variable capacitance in the second delay section in order to set the second capacity load.

17. The variable delay circuit controlling method according to claim 11, wherein
when the difference is less than the predetermined value, the controlling of the first drive capability and the second drive capability decreases the first drive capability and the second drive capability, and when the difference is greater than the predetermined value, the controlling of the first drive capability and the second drive capability increases the first drive capability and the second drive capability.

18. The variable delay circuit controlling method according to claim 12, wherein
when the fourth phase lags behind the third phase, the controlling of the first capacity load and the second capacity load decreases the first capacity load and the second capacity load, and when the fourth phase is ahead of the third phase, the controlling of the first capacity load and the second capacity load increases the first capacity load and the second capacity load.

19. An input/output circuit that adjusts a delay given to a first input signal which is one of a reference signal and a data signal according to a second input signal which is the other of the reference signal and the data signal, the circuit comprising:
a first delay section that changes a first drive capability of the first delay section or a first capacity load of the first delay section according to a first control signal, receives the reference signals, and generates a first delayed signal by giving a first delay to the reference signal;
a second delay section that changes a second drive capability of the second delay section or a second capacity load of the second delay section according to a second control signal, receives the reference signal, and generates a second delayed signal by giving a second delay to the reference signal;
a first capacity load setting section that sets at least one of the first capacity load and the second capacity load by providing the first control signal and the second control signal, in order that the first capacity load differs from the second capacity load;
a first phase comparing section that compares a first phase of the first delayed signal with a second phase of the second delayed signal; and
a drive capability setting section that controls the first drive capability and the second drive capability by providing the first control signal and the second control signal, according to a result of the comparing of the first phase and the second phase, in order that a difference between the first delay and the second delay is equal to a predetermined value and the first drive capability is equal to the second drive capability.

20. The input/output circuit according to claim 19, wherein:
the first delay section receives the first input signal and generates a third delayed signal by giving a third delay to the first input signal;
the second delay section receives the third delayed signal and generates a fourth delayed signal by giving a fourth delay to the third delayed signal; and
the input/output circuit further comprises:
a second phase comparing section that compares a third phase of the second input signal with a fourth phase of the fourth delayed signal; and
a second capacity load setting section that controls the first capacity load and the second capacity load by providing the first control signal and the second control signal, according to a result of the comparing of the third phase and the fourth phase, in order that the third phase is equal to the fourth phase and the first capacity load is equal to the second capacity load.

* * * * *